(12) United States Patent
Rangarajan et al.

(10) Patent No.: US 9,184,707 B2
(45) Date of Patent: Nov. 10, 2015

(54) AMPLIFIER WITH SWITCHABLE COMMON GATE GAIN BUFFER

(71) Applicant: QUALCOMM Incorporated, San Diego, CA (US)

(72) Inventors: Rajagopalan Rangarajan, San Diego, CA (US); Chirag D Patel, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 195 days.

(21) Appl. No.: 13/899,091

(22) Filed: May 21, 2013

(65) Prior Publication Data

US 2014/0197886 A1 Jul. 17, 2014

Related U.S. Application Data

(60) Provisional application No. 61/753,777, filed on Jan. 17, 2013.

(51) Int. Cl.
| | |
|---|---|
| H03F 3/68 | (2006.01) |
| H03F 3/217 | (2006.01) |
| H03F 3/72 | (2006.01) |
| H03G 1/00 | (2006.01) |
| H03G 3/30 | (2006.01) |

(52) U.S. Cl.
CPC ............. *H03F 3/2171* (2013.01); *H03F 3/72* (2013.01); *H03G 1/0029* (2013.01); *H03G 1/0088* (2013.01); *H03G 3/3052* (2013.01)

(58) Field of Classification Search
USPC ...................... 330/295, 124 R, 278
IPC ........................................................ H03F 3/68
See application file for complete search history.

(56) References Cited

U.S. PATENT DOCUMENTS

| | | | |
|---|---|---|---|
| 5,530,404 A * | 6/1996 | Debroux | 330/278 |
| 6,819,179 B2 | 11/2004 | Raja et al. | |
| 6,930,554 B2 | 8/2005 | Mondal et al. | |
| 7,474,158 B1 * | 1/2009 | Yim et al. | 330/311 |
| 7,560,990 B2 | 7/2009 | Lin et al. | |
| 8,244,195 B2 | 8/2012 | Wilson | |
| 2010/0237947 A1 | 9/2010 | Xiong et al. | |
| 2010/0308916 A1 | 12/2010 | Lee et al. | |

(Continued)

FOREIGN PATENT DOCUMENTS

EP 1309083 A1 5/2003

OTHER PUBLICATIONS

International Search Report and Written Opinion—PCT/US2014/011583—ISAEPO—Jul. 4, 2014.

(Continued)

*Primary Examiner* — Patricia T Nguyen
(74) *Attorney, Agent, or Firm* — Smith Risley Tempel Santos LLC

(57) ABSTRACT

An amplifier having a switchable common gate gain buffer is disclosed. In an exemplary embodiment, an apparatus includes a plurality of selectable gain channels that provide constant input impedance at a common input to receive an input signal and generate an output signal having at least one of selected gain and current characteristics. At least two gain channels utilize transistors having different transconductance values. The apparatus also includes at least one impedance network coupled to at least one gain channel to provide the constant input impedance.

12 Claims, 4 Drawing Sheets

(56) References Cited

U.S. PATENT DOCUMENTS

| | | |
|---|---|---|
| 2011/0109389 A1* | 5/2011 | Beffa ............................ 330/260 |
| 2011/0221531 A1 | 9/2011 | Kim et al. |
| 2012/0105157 A1* | 5/2012 | Ahn et al. .................... 330/285 |
| 2014/0240048 A1* | 8/2014 | Youssef et al. ................ 330/296 |
| 2014/0285265 A1* | 9/2014 | Papamichail, Michail ... 330/261 |
| 2014/0300417 A1* | 10/2014 | Xu et al. ....................... 330/278 |

OTHER PUBLICATIONS

Partial International Search Report—PCT/US2014/011583—ISA/EPO—Apr. 14, 2014.

* cited by examiner

AMPLIFIER WITH SWITCHABLE COMMON GATE GAIN BUFFER

CLAIM TO PRIORITY

This patent application claims the benefit of priority from U.S. Provisional Patent Application No. 61/753,777, entitled "GAIN STAGE SWITCHING IN AN AMPLIFIER" filed on Jan. 17, 2013, and assigned to the assignee hereof and hereby expressly incorporated by reference herein.

BACKGROUND

1. Field

The present application relates generally to the operation and design of analog front ends, and more particularly, to the operation and design of amplifiers for use in analog front ends.

2. Background

Wireless devices have become increasingly more complex resulting in more circuitry being incorporated onto smaller chips and circuit boards. For example, a conventional receiver used in a wireless device may include an amplifier coupled to a buffer stage that provides multiple gain modes.

The linearity of a typical common gate buffer stage is set by the standing current in the buffer. At the same time, the current also sets the input impedance of the buffer stage, thus some additional on-chip matching circuits may be required to present a 50-ohm input impedance at the input of the buffer stage to provide a "matchless buffer".

Typically, when the gain of the buffer is reduced, the linearity requirements do not go down. However, if an amplifier precedes the buffer, the linearity requirements may go down as gain provided by the buffer is reduced. Thus, for lower buffer gain modes, the current in the buffer can be decreased, since linearity requirements go down. However, this decrease in current results in a change in the input impedance of the buffer and thus the impedance presented at the buffer input changes, which is undesirable.

Therefore, it would be desirable to have a common gate buffer stage for use with an amplifier in a receiver that maintains constant input impedance as the standing current in the buffer changes thereby providing additional power savings and reduced circuitry.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
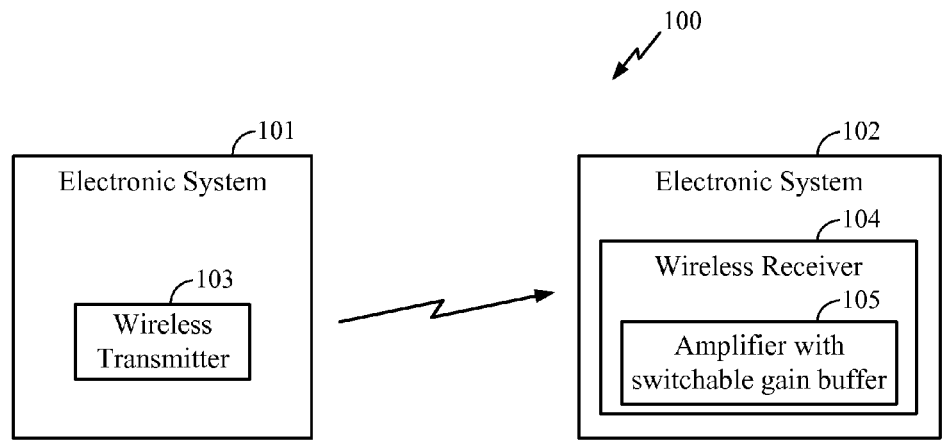
FIG. 1 illustrates wireless communication between two electronic systems.

FIG. 1 illustrates wireless communication between two electronic systems 101 and 102. Electronic system 101 may send information wirelessly from a wireless transmitter 103. Wireless signals are typically encoded as radio frequency ("RF") signals. The signals are received by an antenna at a wireless receiver 104 coupled to electronic system 102. The received signals may be very small and hard to distinguish from ambient noise on the antenna. In various exemplary embodiments, an amplifier with a switchable gain buffer 105 is provided that operates to support reception of wireless signals. As described in more detail below, a wireless receiver may select one of multiple gain channels provided by the amplifier with switchable gain buffer 105 to obtain a desired current and/or gain characteristic.

In an exemplary embodiment, selecting a gain channel from different gain channels having the same gain and different currents can be performed based on linearity requirements. For example, at high gain, a gain channel is selected to have higher current than other gain channels and corresponding higher linearity. At lower gain, the linearity tolerance may be relaxed and a different gain channel may be selected that has lower current consumption, thereby saving power. Thus, the gain channels may have the same gain, but each channel may consume different amounts of current so that power consumption may be reduced or optimized based on gain channel selection.

In another exemplary embodiment, selecting a gain channels from different gain channels can be performed based on the desired gain. For example, when the received signal is very small (e.g., below a particular threshold), one of the gain channels having higher gain that other gain channels may be selected and configured to amplify the received signal. When the receive signal is stronger (e.g., above a particular threshold), one of the gain channels having a lower gain may be selected. In various exemplary embodiments, a selection from a plurality of gain channels is made to improve amplification and reception of the received signal.

Figure 2:
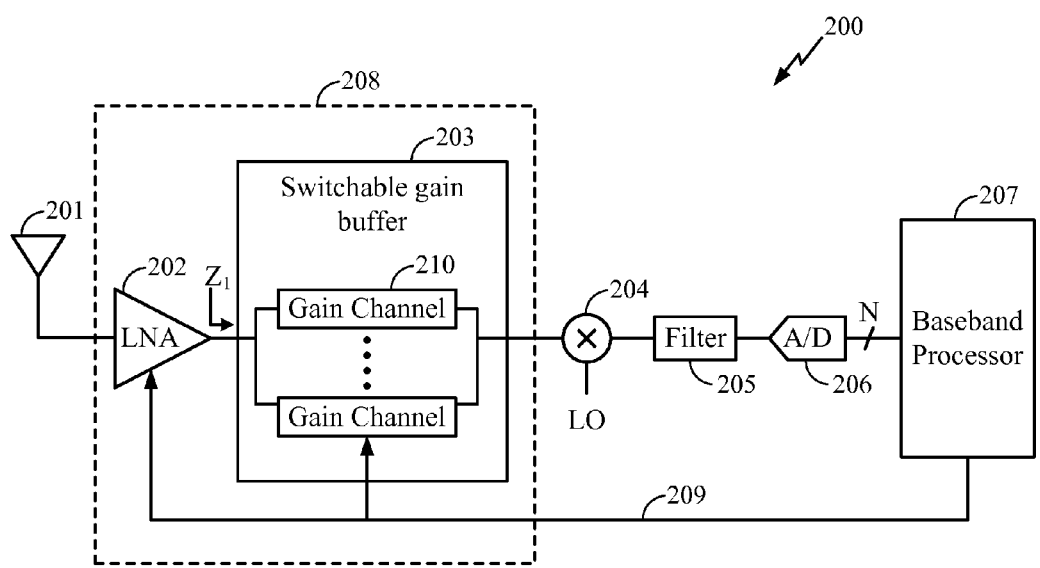
FIG. 2 shows a wireless receiver that uses an exemplary embodiment of an amplifier with switchable gain buffer.

FIG. 2 shows a wireless receiver 200 that includes an exemplary embodiment of an amplifier with a switchable gain buffer 208. RF signals may be received by antenna 201. A low noise amplifier ("LNA") 202 receives the RF signals and provides first stage amplification. In an exemplary embodiment, a switchable gain buffer 203 is coupled to an output of LNA 202 to receive the amplified RF signals. The switchable gain buffer 203 includes multiple gain channels 210. Each gain channel may have different current and/or gain characteristics. During operation, the switchable gain buffer 203 provides constant input impedance ($Z_1$) to the LNA 202 regardless of the gain channel that is selected. Thus, depending on the desired current and/or gain, different gain channels can be selected having different current consumption but still maintaining the constant input impedance ($Z_1$).

The LNA 202 and switchable gain buffer 203 also receive control signals 209 from a baseband processor 207. The control signals 209 from the baseband processor 207 may be used to select and/or configure the gain of the LNA 202 and/or enable one of the gain channels of the switchable gain buffer 203. The output of the switchable gain buffer 203 is coupled to a mixer 204 (aka, "demodulator" or "down-converter"). The output of the mixer 204 is input to a filter 205 and an output of the filter 205 is input to an analog-to-digital converter ("A/D") 206. Digital signals (N) representing the down-converted signals are output from the A/D 206 and received and processed by the baseband processor 207, which may be configured to perform digital signal processing operations on the digitized signals.

In an exemplary embodiment, the baseband processor 207 monitors the signal strength of the downconverted signals, and in response, configures the LNA 202 and/or the switchable gain buffer 203 to provide a desired amount of gain and current consumption. When the signal strength drops, the LNA 202 and/or the switchable gain buffer 203 may be reconfigured so that a gain channel having higher current and better linearity is selected. When the signal strength increases, the gain of the LNA may be reduced and/or a different gain channel of the switchable gain buffer 203 having lower current consumption may be selected to reduce power consumption.

Figure 3:
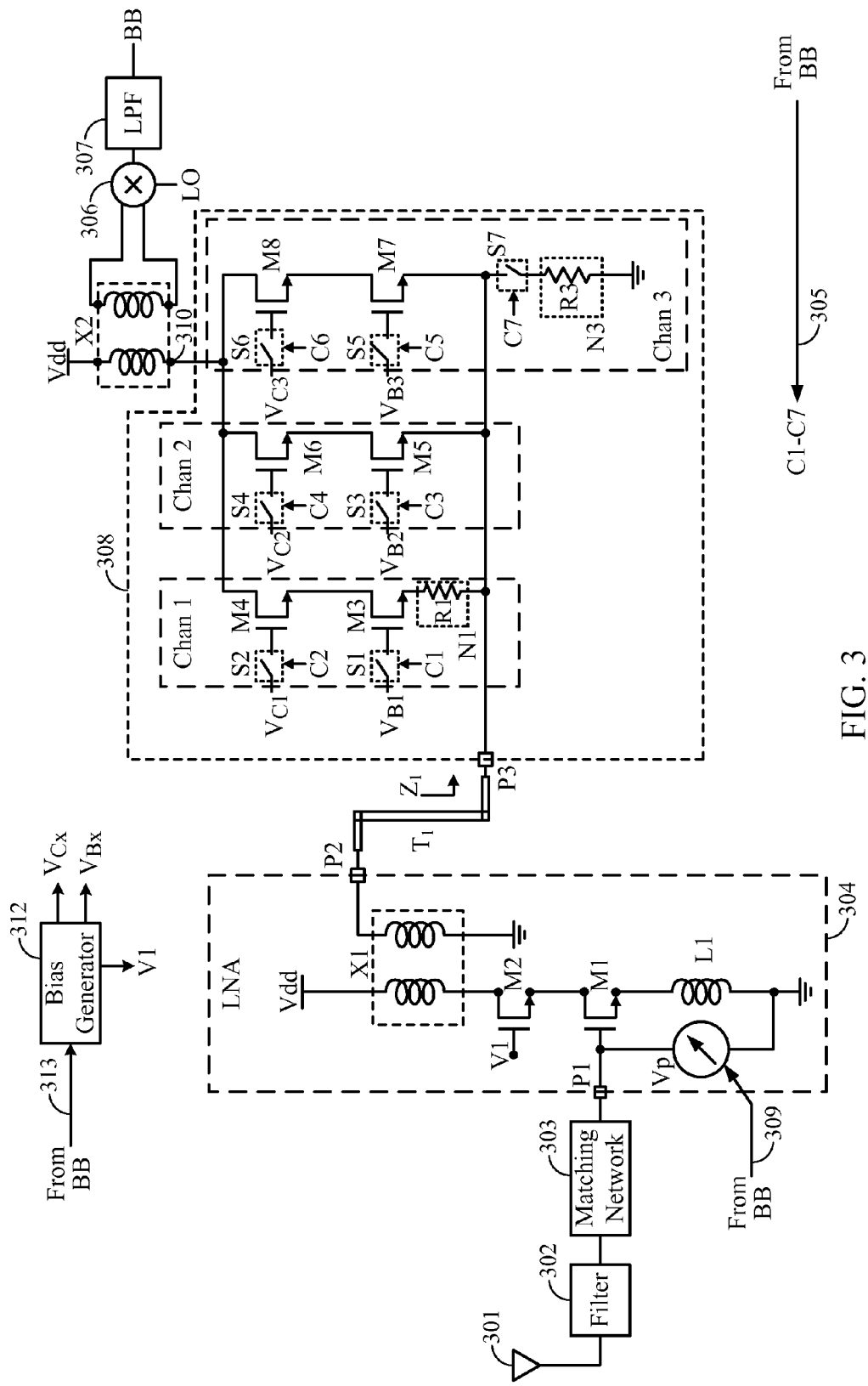
FIG. 3 shows an exemplary detailed embodiment of an amplifier with switchable gain buffer.

FIG. 3 shows an exemplary detailed embodiment of an amplifier 304 and a switchable gain buffer 308. For example, the amplifier 304 and switchable gain buffer 308 are suitable for use as the amplifier 202 and switchable gain buffer 203 shown in FIG. 2. RF signals received at antenna 301 are passed through filter 302 and coupled to the LNA 304 by a matching network 303. Filter 302 may be a surface acoustic wave ("SAW") filter, for example. In this exemplary embodiment, the output of matching network 303 is connected to the pin (P1) of LNA 304. The term "pin" as used herein may refer to the pin of an integrated circuit ("IC") package, for example, or a pad of an IC. In other exemplary embodiments, IC pins may be in different locations in the circuit and some pins may be eliminated. The LNA 304 includes transistor M1 having a gate terminal connected to P1. The gain of the LNA 304 may be adjusted by changing a voltage level at the gate of M1 using programmable voltage source Vp, which is connected between the gate of M1 and a signal ground. In an exemplary embodiment, the baseband processor outputs a gain control signal 309 that controls the programmable voltage source Vp to set the gain of the LNA 304.

A source terminal of M1 is connected to a first terminal of inductor L1. A second terminal of the inductor L1 is connected to a first reference voltage (e.g., signal ground). A drain terminal of M1 is connected to a source terminal of transistor M2. A gate terminal of M2 is connected to a bias voltage (V1). A drain terminal of M2 is connected to a first terminal of a first inductive coil of transformer X1. A second terminal of the first inductive coil of transformer X1 is connected to a second reference voltage (e.g., Vdd), which is greater than the first reference voltage. A second inductive coil of transformer X1 has a first terminal connected to the signal ground and a second terminal connected to an output pin (P2). The LNA 304 is configured as a cascode amplifier. An input signal received at P1 is amplified by the LNA 304 according to the gain setting provided by Vp and the amplified signal is produced on P2.

In this exemplary embodiment, a transmission line ($T_1$) is connected between P2 and pin (P3) of the switchable gain buffer 308. The switchable gain buffer 308 comprises three (3) gain channels (e.g., Chan 1, Chan 2, and Chan 3). In various exemplary embodiments, the gain channels (Chan 1, Chan 2, and Chan 3) may have the same or different gains and/or current consumption. It should also be noted that any number of gain channels may be utilized.

The pin P3 acts as a common input terminal to all the gain channels and the amplified signal input at P3 is therefore connected to all the gain channels. The output of each gain channel is coupled to a first terminal 310 of a first coil of transformer X2. A second terminal of the first coil of the transformer X2 is connected to the supply voltage Vdd. The output of the transformer X2 is across first and second terminals of a second coil. The first and second terminals of the second coil of transformer X2 produce a differential signal that is coupled to the input of mixer 306. Another input of mixer 306 receives a local oscillator (LO) signal. The LO signal may be a single ended or a differential signal. An output of the mixer 306 is coupled to a low pass filter 307 ("LPF"), which produces baseband signals to be processed by a baseband processor ("BB"). It should also be noted that the LPF 307 could also be configured as a band pass filter (BPF) in a different embodiment.

During operation, the gain of the LNA 304 is changed by controlling Vp (using gain control signal 309) so that the LNA 304 generates a signal at P3 having a desired gain. The gain channels (Chan 1, Chan 2, and Chan 3) are configured based on the desired gain and/or current consumption. During operation, one of the available gain channels may be selected to couple the signal at P3 to the terminal 310 of transformer X2. The selected gain channel may provide lower current consumption than other gain channels to save power. Alternatively, the selected gain channel may provide a desired gain level when compared to other gain channels. For example, Chan 1 may have a higher gain than Chan 2, and Chan 2 may have a higher gain than Chan 3, so that different channels provide different amounts of gain. Thus, the appropriate gain channel can be selected based on the amount of gain or current desired. It should be noted that the gain channels can be configured to provide any desired gain and/or current characteristics.

The buffer 308 is configured so that regardless of the gain channel that is selected, the input impedance ($Z_1$) seen by the LNA 304 remains constant or substantially the same. For example, the input impedance ($Z_1$) may be set to 50 ohms or other suitable value. As illustrated in FIG. 3, the gain channels comprise common gate amplifier stages. For instance, Chan 1 includes NMOS transistor M3 configured as a common gate amplifier. The source of M3 is connected to P3 through an impedance network (N1) comprising resistor R1. A drain of M3 is connected to a source of NMOS transistor M4. A gate of M3 is connected to a bias voltage $V_{B1}$ through a switch, S1. M4 is connected in a cascode configuration with M3. A gate of M4 is connected to a bias voltage $V_{C1}$ through another switch, S2, and a drain of M4 is connected to the terminal 310 of transformer X2, which acts as a load on the common gate amplifier stage.

Like Chan 1, Chan 2 includes an NMOS transistor M5 configured as a common gate amplifier and M6 configured in cascode with an output connected to the terminal 310 of the transformer X2. For matching purposes described in more detail below, the source of M5 is directly connected to P3. The gate of M5 is connected to bias voltage $V_{B2}$ through switch S3 and the gate of M6 is connected to bias voltage $V_{C2}$ through switch S4.

Chan 3 includes an NMOS transistor M7 configured as a common gate amplifier and M8 configured in cascode with an output that is connected to the terminal 310 of the transformer X2. The source terminal of transistor M7 is directly connected to the pin P3. For matching purposes, Chan 3 includes an impedance network (N3) comprising resistor R3 connected in series with switch S7 to selectively connect R3 to ground when Chan 3 is active. The gate of transistor M7 is connected to bias voltage $V_{B3}$ through switch S5 and the gate of transistor M8 is connected to bias voltage $V_{C3}$ through switch S6.

In this exemplary embodiment, transistors M3, M5, and M7 are selectively connected to the bias voltages ($V_{Bx}$) and transistors M4, M6, and M8 are selectively connected to the bias voltages ($V_{Cx}$). In various exemplary embodiments, the bias voltages ($V_{Bx}$) and ($V_{Cx}$) can be configured to have any desired values. For example, the bias voltages associated with the same or different gain channels may be the same or different as desired.

A bias generator 312 is configured to generate the bias voltages V1, VCx and VBx based on a bias control signal 313 from a baseband processor. For example, in an exemplary embodiment, the bias generator comprises one or more digital to analog converters that convert received digital signals into the appropriate bias voltage. For example, the baseband processor 207, shown in FIG. 2, outputs the bias control signal 313 for use by the bias generator 312. Thus, the baseband processor 207 can configure the levels of any of the bias voltages.

During operation, switch control signals 305 (c1-c7) are received from a baseband processor or some other entity at the device. The switch control signals 305 (c1-c7) operate to open and close the switches (S1-S7) to enable any desired gain channel configuration. For example, Chan 1 is selected (or enabled) by closing switches S1 and S2 and opening switches S3-S7. Chan 2 is selected by closing switches S3 and S4 and opening switches S1-S2, and S5-S7. Chan 3 is selected by closing switches S5-S7 and opening switches S1-S4. In various exemplary embodiments, the switches (S1-S7) could be controlled in groups or individually to enable or disable selected gain channels. For example, the switches associated with the same or different channels may be controlled together and/or individually as desired. Thus, it is possible to enable multiple gain channels at the same time.

Transistors Sized to Maintain Input Impedance

The linearity of a common gate stage is set by standing current in the stage, where higher current results in higher linearity and lower current results in lower linearity. At the same time, the current also sets the input impedance of the common gate stage. Thus, standing current in each gain channel may impact matching at the input of each gain channel. In FIG. 3, the transmission line $T_1$ may have a characteristic impedance of 50 Ohms. The transmission line $T_1$ may be a trace on a circuit board between ICs or a metallization line between components on an IC.

In various exemplary embodiments, Chan 1, Chan 2, and Chan 3 are configured to provide constant input impedance ($Z_1$) to match to the transmission line $T_1$. In an exemplary embodiment, the devices M3, M5, and M7 are sized and configured with impedance networks N1 and N3 (i.e., resistors R1 and R3) to provide constant input impedance. For example, in an exemplary embodiment, M3 is sized larger than M5, and M5 is sized larger than M7. In a particular exemplary embodiment, M3 is a 25 ohm device, M5 is a 50 ohm device, and M7 is a 100 ohm device. For example, the input resistance of a transistor is inversely proportional to transconductance (GM) of the transistor and therefore the transconductances of the transistors are set to obtain the desired resistances and resulting input impedance. Accordingly, to match the (T1) transmission line's 50 ohm impedance, M3 (25 ohms) is configured in series with the impedance network N1 comprising 25 ohm resistor (R1). Thus, when Chan 1 is selected, the switchable gain stage 308 produces 50 ohm input impedance that matches the 50 ohm impedance of the transmission line $T_1$. Current consumption may be reduced by selecting Chan 2, which uses a smaller transistor with corresponding lower current consumption. When Chan 2 is selected, M5 (50 ohms) does not require any supplemental impedance network to match to the transmission line $T_1$. The size of the common gate transistor M5 is configured to match to the transmission line. For further reductions in current, Chan 3 may be selected. In this case, M7 (100 ohms) is configured in parallel with the impedance network N3 comprising 100 ohm resistor (R3) to produce the 50 ohm input impedance.

Accordingly, in various exemplary embodiments, each gain channel comprises a common gate stage with the different stages having different transistor device sizes (or different transconductance) to produce different currents and/or different gains while maintaining constant input impedance. Additionally, one or more of the gain channels may include an impedance network (e.g., a resistor, an inductor, a capacitor, or combinations thereof) configured based on the size of its corresponding transistor to produce a constant matching input impedance to match to the transmission line $T_1$. For example, each gain channel provides an input impedance that is substantially the same as other gain channels to provide an overall constant input impedance.

Figure 4:
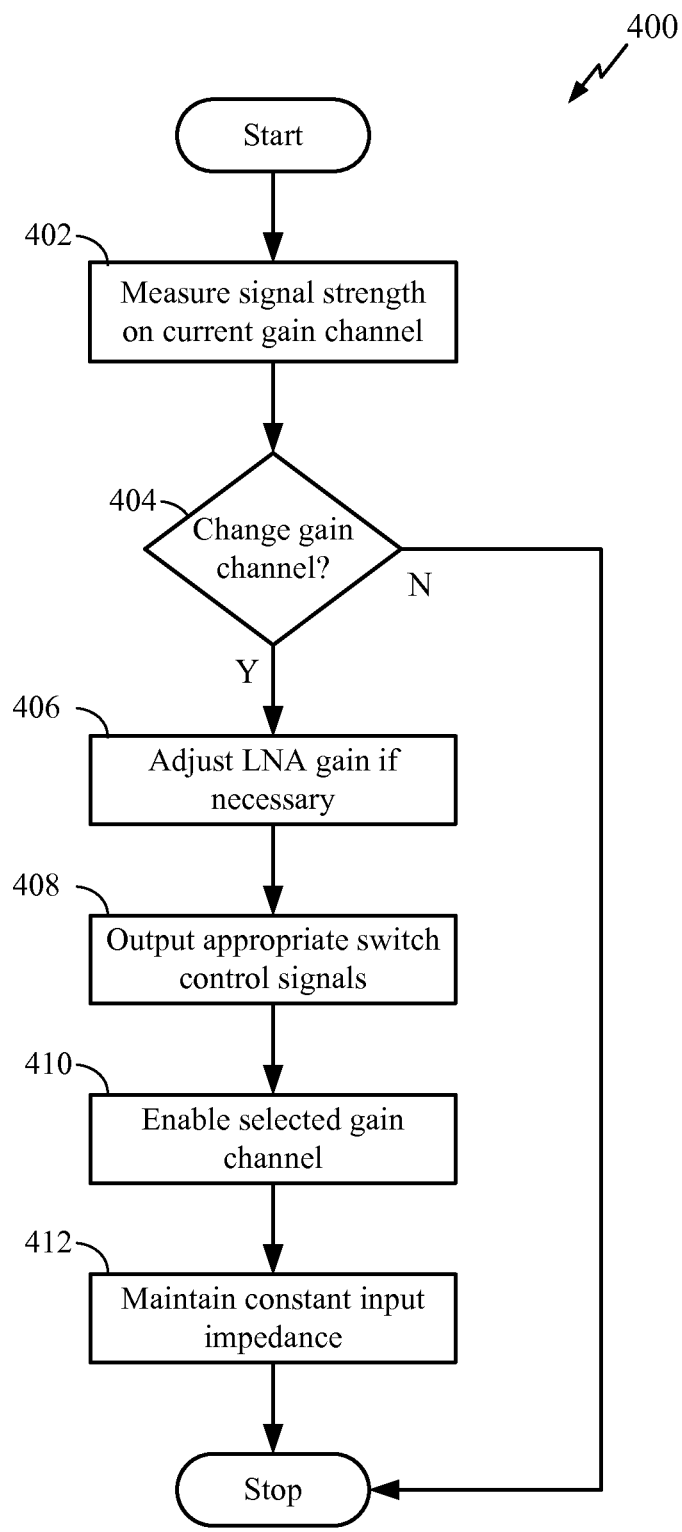
FIG. 4 shows an exemplary embodiment of a method for amplification of signals utilizing an amplifier and switchable common gate gain buffer in a wireless device.

FIG. 4 shows an exemplary embodiment of a method 400 for amplification of signals utilizing an amplifier and switchable common gate gain buffer in a wireless device. For example, the method 400 is suitable for use with the amplifier 304 and switchable gain buffer 308 shown in FIG. 3.

At block 402, a measurement of signal strength on the current gain channel is performed. In an exemplary embodiment, the baseband processor 207 operates to receive a baseband signal determined from a received RF signal that is processed by the amplifier 304 and switchable gain buffer 308 shown in FIG. 3. It is assumed that the switchable gain buffer 308 is set so that one of the gain channels (Chan 1, Chan 2, or Chan 3) is enabled.

At block 404, a determination is made as to whether to change the gain buffer to process the received signals with a different gain channel. For example, the baseband processor 207 may determine that a change in signal gain or current consumption is required and determine that a different gain channel should be enabled. If a different gain channel is required, the method proceeds to block 406. If a different gain channel is not required the method ends.

At block 406, the LNA gain is adjusted if necessary. In an exemplary embodiment, if a change in the LNA gain is necessary, the gain of the LNA 304 is adjusted by changing a voltage level at the gate of M1 using programmable voltage source Vp, which is connected between the gate of M1 and a signal ground. In an exemplary embodiment, the baseband processor 207 outputs the gain control signal 309 that controls the programmable voltage source Vp to set the gain of the LNA 304.

At block 408, the appropriate switch control signals are output to enable the desired gain channel. In an exemplary embodiment, the baseband processor 207 outputs the control signals (c1-c7) to open and close the appropriate switches (S1-S7) thereby enabling the desired gain channel.

At block 410, the desired gain channel is enabled. In an exemplary embodiment, the control signals (c1-c7) are received by the switchable gain buffer and these signals operate to open and close the appropriate switches to enable the desired gain channel. Furthermore, the baseband processor 207 outputs the bias control signal 313 to generate the appropriate bias signals to enable and/or disable the appropriate gain channels.

At block 412, constant input impedance is maintained after the desired gain channel is enabled. In an exemplary embodiment, the gain channels are configured with transistor devices that are sized to provide constant input impedance while providing selectable gain and/or current consumption. In an exemplary embodiment, an impedance network associated with a selected gain channel is used to maintain the constant input impedance. For example, the Chan 3 gain channel includes a device sized for 100 ohms and includes an additional impedance network N3 comprising a 100 ohm resistor in parallel to result in the desired 50 ohm input impedance.

Accordingly, the method 400 provides for amplification of signals utilizing an amplifier and switchable common gate gain buffer in a wireless device. It should be noted that the operations of the method 400 can be rearranged, modified or changed by one with skill in the art such that other equivalent methods are possible.

Figure 5:
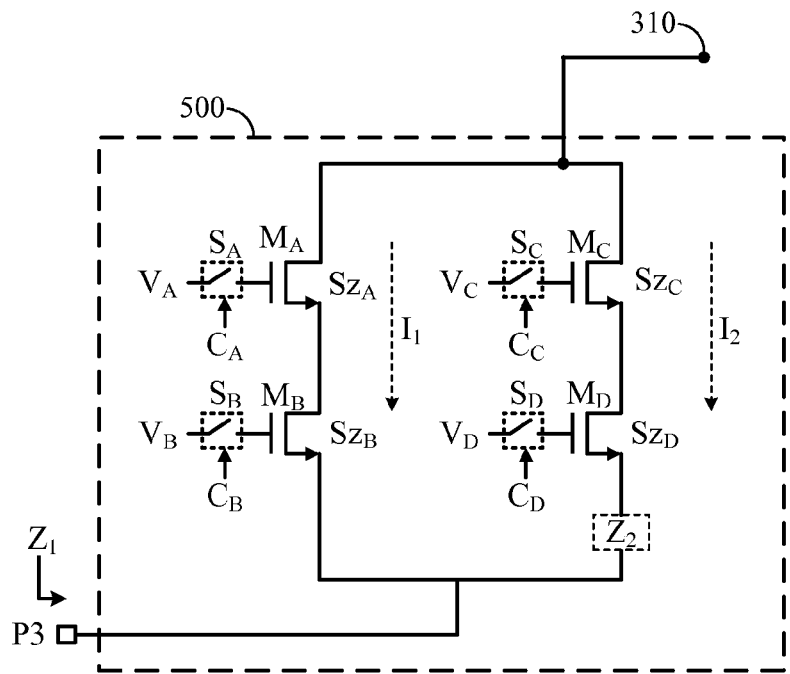
FIG. 5 shows an exemplary embodiment of a gain channel for use in a switchable gain buffer.

FIG. 5 shows an exemplary embodiment of a gain channel 500 for use in a switchable gain buffer. For example, the gain channel 500 is suitable for use in the switchable gain buffer 308 shown in FIG. 3. The gain channel 500 comprises four transistors devices ($M_A$-$M_D$) coupled to receive four bias signals ($V_A$-$V_D$) through four switches ($S_A$-$S_D$), respectively. The four switches ($S_A$-$S_D$) are controlled by four switch control signals ($C_A$-$C_D$). For example, in an exemplary embodiment, the switch control signals ($C_A$-$C_D$) are generated by the baseband processor 207 shown in FIG. 2 and the bias signals ($V_A$-$V_D$) are generated by the bias generator 312 shown in FIG. 3.

The transistors $M_B$ and $M_D$ are coupled to receive the input signal at pin P3. In an alternative exemplary embodiment, the input signal flows through optional impedance network $Z_2$ to transistor $M_D$. The impedance network $Z_2$ comprises a resistor having a resistance value configured to combine with the transistor $M_D$. It should be noted that the impedance network $Z_2$ may also comprise inductors, capacitors, or any other components to provide a desired impedance value. The transistors $M_A$ and $M_C$ are coupled to the output terminal 310. The transistors $M_A$ and $M_B$ are connected together so that when activated, current $I_1$ flows as indicated. The transistors $M_C$ and $M_D$ are connected together so that when they are activated, the current $I_2$ flows as indicated.

The transistors ($M_A$-$M_D$) are sized to have sizes ($Sz_A$-$Sz_D$), respectively. For example, the sizes of the transistors are determined from their associated transconductance. In an exemplary embodiment, to maintain the desired input impedance ($Z_1$) for the gain channel 500, the sizes of the transistors ($M_A$-$M_D$) combine to produce the desired input impedance $Z_1$. In another exemplary embodiment, the sizes of the transistors ($M_A$-$M_D$) and the impedance network $Z_2$ combine to produce the desired input impedance $Z_1$. In another exemplary embodiment, the bias signals ($V_A$-VD) are adjusted to set the currents $I_1$ and $I_2$, thereby setting the impedance resulting from the combination of the transistors ($M_A$-$M_D$) and optionally $Z_2$. For example, if the currents I1 and I2 are reduced by ¼ the impedance provided by the transistor devices is reduced by ½. Thus, by adjusting the size of the transistors ($M_A$-$M_D$) and/or by adjusting the size of the transistors ($M_A$-$M_D$) and the bias voltages, (which set the currents $I_1$ and $I_2$), and optionally using the impedance $Z_2$, the input impedance $Z_1$ of the gain channel 500 can be set to the desired value.

Figure 6:
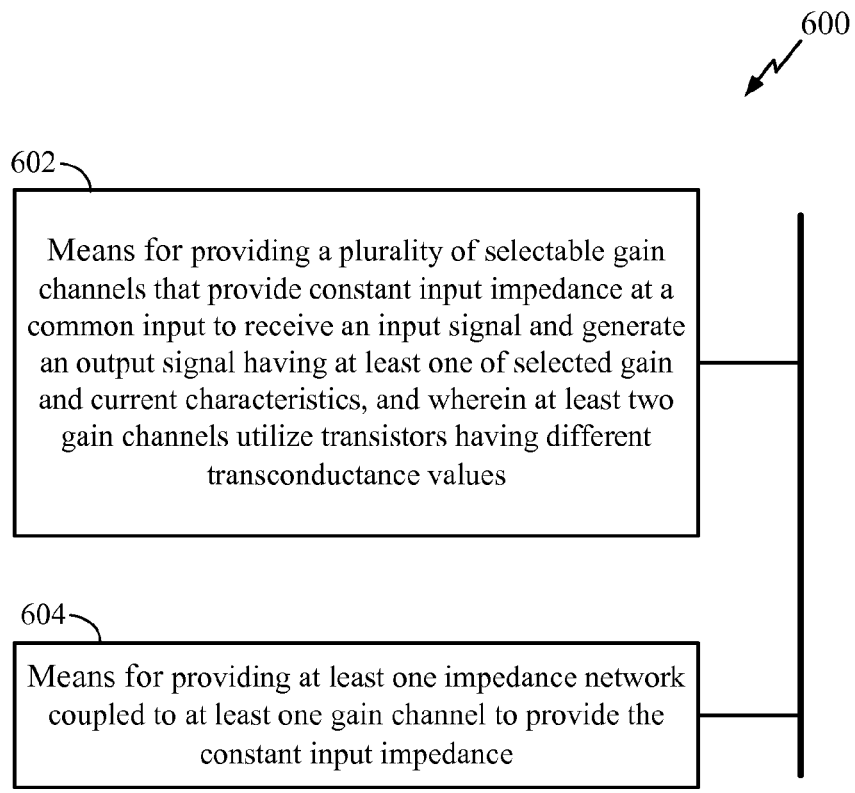
FIG. 6 shows an exemplary embodiment of a switchable gain buffer apparatus.

FIG. 6 shows an exemplary embodiment of a switchable gain buffer apparatus 600. For example, the apparatus 600 is suitable for use as the switchable gain buffer 308 shown in FIG. 3. In an aspect, the apparatus 600 is implemented by one or more modules configured to provide the functions as described herein. For example, in an aspect, each module comprises hardware and/or hardware executing software.

The apparatus 600 comprises a first module comprising means (602) for providing a plurality of selectable gain channels that provide constant input impedance at a common input to receive an input signal and generate an output signal having at least one of selected gain and current characteristics, and wherein at least two gain channels utilize transistors having different transconductance values, which in an aspect comprises the switchable gain buffer 308.

The apparatus 600 comprises a second module comprising means (604) for providing at least one impedance network coupled to at least one gain channel to provide the constant input impedance, which in an aspect comprises the impedance networks N1 and N3.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
    a low-noise amplifier configured to amplify an input signal to produce a buffer input signal in response to a selected gain;
    a gain buffer having an input coupled to an output of the low-noise amplifier, the gain buffer comprising a plurality of selectable gain channels that provide constant input impedance at a common input to receive the buffer input signal and generate an output signal having at least one of selected gain and current characteristics, wherein at least two gain channels utilize transistors having a common-gate configuration and having different transconductance values, the gain buffer configured to produce the output signal in response to the buffer input signal and a gain of a selected gain channel; and
    at least one impedance network coupled to at least one gain channel to provide the constant input impedance.

2. The apparatus of claim 1, further comprising a plurality of control signals configured to select at least one of the selectable gain channels to generate the output signal and configured to select the gain of the low-noise amplifier.

3. The apparatus of claim 1, the at least one impedance network comprises at least one of a resistor, a capacitor, and an inductor.

4. The apparatus of claim 1, each gain channel comprising at least one cascode transistor pair that is enabled by switchable bias voltages.

5. The apparatus of claim 1, the input impedance is configured for 50 ohms.

6. The apparatus of claim 1, at least one gain channel configured to consume less current while providing the same or lower gain as other gain channels.

7. An apparatus comprising:
    means for amplifying an input signal to produce a buffer input signal in response to a selected gain;
    means for providing a plurality of selectable gain channels that provide constant input impedance at a common input to receive the buffer input signal and generate an output signal having at least one of selected gain and current characteristics, and wherein at least two gain channels utilize transistors having a common-gate configuration and having different transconductance values, the means for providing a plurality of selectable gain channels configured to produce the output signal in response to the buffer input signal and a gain of a selected gain channel; and
    means for providing at least one impedance network coupled to at least one gain channel to provide the constant input impedance.

8. The apparatus of claim 7, further comprising means for providing a plurality of control signals configured to select at least one of the selectable gain channels to generate the output signal and configured to select the gain of the means for producing an amplified buffer input signal.

9. The apparatus of claim 7, the means for providing the at least one impedance network comprising at least one of a resistor, a capacitor, and an inductor.

10. The apparatus of claim 7, each gain channel comprising at least one cascode transistor pair that is enabled by switchable bias voltages.

11. The apparatus of claim 7 the input impedance is configured for 50 ohms.

12. The apparatus of claim 7, at least one gain channel configured to consume less current while providing the same or lower gain as other gain channels.

* * * * *